US011425848B2

(12) United States Patent
Mehkri et al.

(10) Patent No.: US 11,425,848 B2
(45) Date of Patent: Aug. 23, 2022

(54) ADJUSTABLE CARRIER WITH CHANGEABLE CORE

(71) Applicant: Flex Ltd., Singapore (SG)

(72) Inventors: Zohair Mehkri, San Jose, CA (US); Anwar Mohammed, San Jose, CA (US); Jesus Tan, San Jose, CA (US); David Geiger, Dublin, CA (US); Murad Kurwa, San Jose, CA (US)

(73) Assignee: FLEX LTD., Singapore (SG)

(*) Notice: Subject to any disclaimer, the term of this patent is extended or adjusted under 35 U.S.C. 154(b) by 309 days.

(21) Appl. No.: 15/807,154

(22) Filed: Nov. 8, 2017

(65) Prior Publication Data

US 2018/0132392 A1 May 10, 2018

Related U.S. Application Data

(60) Provisional application No. 62/418,895, filed on Nov. 8, 2016.

(51) Int. Cl.
*H05K 13/00* (2006.01)
*H05K 7/14* (2006.01)
*H05K 1/14* (2006.01)

(52) U.S. Cl.
CPC ......... *H05K 13/0061* (2013.01); *H05K 1/142* (2013.01); *H05K 7/1417* (2013.01); *H05K 7/1424* (2013.01); *H05K 7/1427* (2013.01); *H05K 7/1435* (2013.01); *Y10T 29/53265* (2015.01)

(58) Field of Classification Search
CPC ......... H05K 13/0061; H05K 13/0069; H05K 1/142; H05K 7/1424; H05K 7/1427; H05K 7/1435; H05K 7/1417; Y10T 29/53265
See application file for complete search history.

(56) References Cited

U.S. PATENT DOCUMENTS

| | | | | | |
|---|---|---|---|---|---|
| 4,155,447 | A | * | 5/1979 | Edwards | H05K 7/1424 206/454 |
| 4,614,385 | A | * | 9/1986 | Gendernalik | H05K 13/0061 211/41.17 |
| 6,166,916 | A | * | 12/2000 | Jelinger | H05K 7/1417 206/706 |
| 6,328,169 | B1 | * | 12/2001 | Matsuda | H05K 13/0069 211/175 |
| 7,229,000 | B2 | * | 6/2007 | Wang | H05K 13/0069 228/47.1 |
| 2002/0005336 | A1 | * | 1/2002 | Rehm | H05K 13/0069 198/803.11 |

(Continued)

FOREIGN PATENT DOCUMENTS

JP 2005042170 A * 2/2005

*Primary Examiner* — A. Dexter Tugbang
(74) *Attorney, Agent, or Firm* — Weber Rosselli & Cannon LLP

(57) ABSTRACT

A carrier assembly configured to facilitate manufacture of a printed circuit board assembly includes a bottom frame defining a generally rectangular configuration and having a length and a width. The bottom frame is adjustable to vary at least one of the length or the width thereof. The assembly further includes a core releasably positionable on the bottom frame and configured to support a circuit board thereon. A carrier assembly system includes the bottom frame and a plurality of cores.

13 Claims, 4 Drawing Sheets

(56) References Cited

U.S. PATENT DOCUMENTS

2008/0084675 A1\* 4/2008 Amirali .............. H05K 13/0069
   361/752
2014/0022752 A1\* 1/2014 Wille ..................... H05K 1/142
   361/792

\* cited by examiner

ADJUSTABLE CARRIER WITH CHANGEABLE CORE

CROSS-REFERENCE TO RELATED APPLICATIONS

This application claims the benefit of, and priority to, U.S. Provisional Patent Application No. 62/418,895, entitled "3D PRINTED CHANGEABLE CORE WITH ADJUSTABLE COMMON SMT CARRIER" and filed on Nov. 8, 2016, the entire contents of which are hereby incorporated herein by reference.

TECHNICAL FIELD

The present disclosure relates to Printed Circuit Board Assemblies (PCBAs) and, more specifically, to carriers and methods facilitating the manufacture of PCBAs that utilized, for example, Surface Mount Technology (SMT).

BACKGROUND

The process flow for manufacturing PCBAs including SMT components includes, among other steps, circuit board loading, screen printing of solder paste onto the circuit board, solder paste inspection, component pick and place, automatic optical inspection, and reflow. Throughout and/or between some of all of these process flow steps, the circuit board being manufactured is disposed on a carrier to facilitate the transport thereof.

Carriers currently in use are manufactured specifically for a particular circuit board and/or for a limited number of stations along the process flow. Thus, the carriers currently in use are not versatile but, rather, a different carrier is needed for each type of circuit board to be manufactured and/or for different stations along the process flow. Providing a specific carrier for each type of circuit board to be manufactured inhibits reuse of the carriers and increases costs. The need to remove the circuit board being manufactured and swap out carriers along the process flow may lead to loss of coplanarity of the circuit board throughout the manufacturing process, which may lead to manufacturing issues.

It would therefore be desirable to provide a carrier that is capable of being reconfigured for use with different types of circuit boards and/or at different stations along the process flow.

SUMMARY

The present disclosure provides adjustable carriers, carriers with changeable cores, and methods that enable carrier reconfiguration for use with different types of circuit boards and/or at different stations along the process flow for manufacturing PCBAs, e.g., PCBAs including SMT components. The adjustable carriers, carriers with changeable cores, and methods ensure coplanarity of the circuit board throughout the manufacturing process or portions thereof. These and other aspects and features of the present disclosure are detailed below. To the extent consistent, any of the aspects and features described herein may be used in conjunction with any or all of the other aspects and features described herein.

Provided in accordance with the present disclosure is a carrier assembly configured to facilitate manufacture of a printed circuit board assembly. The carrier assembly includes a bottom frame and a core. The bottom frame defines a generally rectangular configuration and has a length and a width. The bottom frame is adjustable to vary at least one of the length or the width thereof. The core is releasably positionable on the bottom frame and configured to support a circuit board thereon.

In an aspect of the present disclosure, the carrier assembly further includes a top frame defining a generally rectangular configuration and having a length and a width. The top frame is adjustable to vary at least one of the length or the width thereof and is releasably engagable with the bottom frame to retain the core therebetween. In such aspects, at least one clamp may be provided to releasably engage the top and bottom frames with one another.

In another aspect of the present disclosure, the core is customized to the circuit board configured to be supported thereon. Further, the core may be formed from a high temperature grade plastic via 3D printing.

In another aspect of the present disclosure, the bottom frame is formed from a metal.

In still another aspect of the present disclosure, the bottom frame is reusable and the carrier is disposable.

In yet another aspect of the present disclosure, the bottom frame is adjustable to vary each of the length and the width thereof.

In still yet another aspect of the present disclosure, the bottom frame is configured to retain the core in two axial directions and the core is configured to retain the circuit board in two axial dimensions.

A carrier assembly system configured to facilitate manufacture of a printed circuit board assembly provided in accordance with the present disclosure includes a bottom frame according to any of the aspects above or otherwise provided herein, and a plurality of cores. Each core defines a different configuration and is configured for releasable positioning on the bottom frame. Each core is configured to support a different circuit board thereon.

In an aspect of the present disclosure, the carrier assembly system further includes a top frame, similarly as detailed above. At least one clamp, as also detailed above, may likewise be provided.

In another of the present disclosure, each core is formed from a high temperature grade plastic via 3D printing.

A method of manufacturing a printed circuit board assembly provided in accordance with the present disclosure includes selecting a core based upon a configuration of a printed circuit board to be manufactured, adjusting a bottom frame based upon the core selected, seating the core on the bottom frame, seating a circuit board of the printed circuit board to be manufactured on the core, and moving the bottom frame through at least one assembly station.

In an aspect of the present disclosure, adjusting the bottom frame includes varying at least one of a length or a width of the bottom frame.

In another aspect of the present disclosure, the method further includes engaging a top frame on the bottom frame to retain the circuit board and the core therebetween.

BRIEF DESCRIPTION OF THE DRAWINGS

Various aspects and features of the present disclosure are described hereinbelow with reference to the drawings wherein like numerals designate identical or corresponding elements in each of the several views and.

DETAILED DESCRIPTION

Figure 1A:
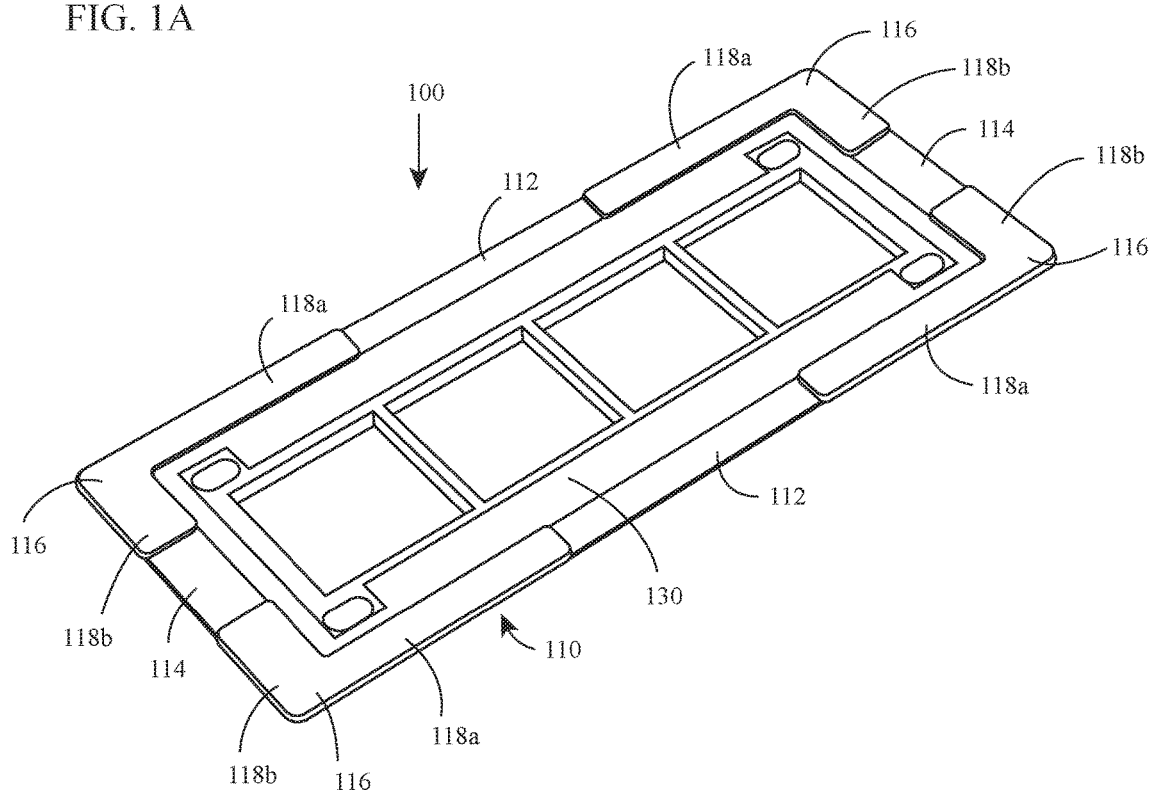
FIG. 1A is a perspective view of a carrier assembly provided in accordance with aspects of the present disclosure, with a cover thereof removed.
Figure 1B:
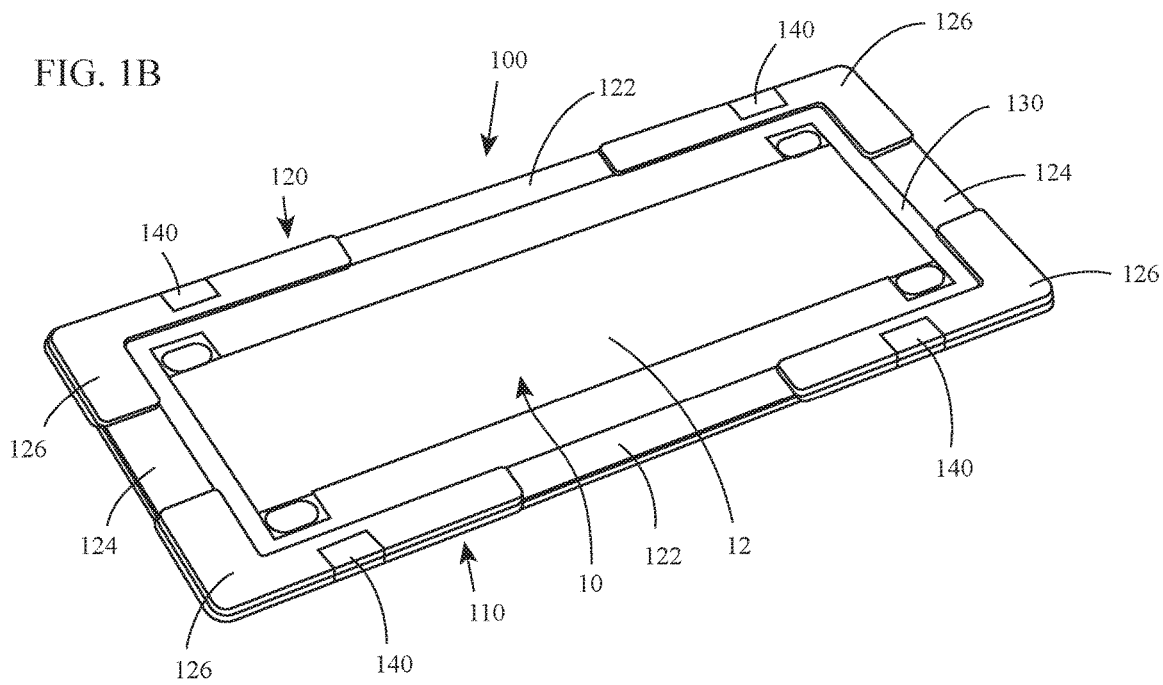
FIG. 1B is a perspective view of the carrier assembly of FIG. 1A supporting a circuit board and including the cover disposed thereon.
Figure 2:
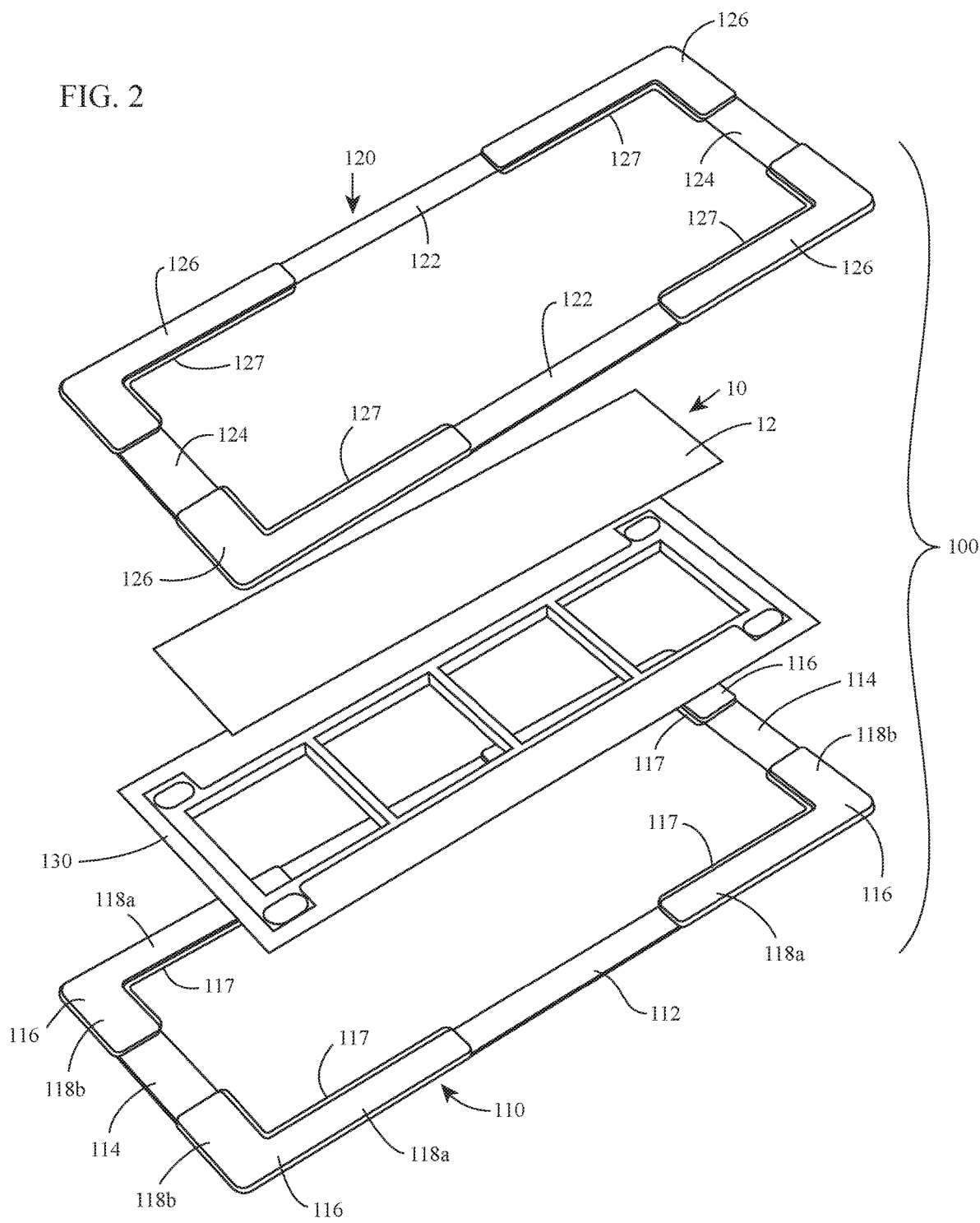
FIG. 2 is an exploded, perspective view of the carrier assembly of FIG. 1A, including a circuit board to be supported thereon.

With reference to FIGS. 1A, 1B, and 2, a carrier assembly provided in accordance with the present disclosure and configured for supporting a Printed Circuit Board Assembly (PCBA) 10 during at least a portion of the manufacture thereof is show generally identified by reference numeral 100. Carrier assembly 100 includes a bottom frame 110, a top frame 120, and a core 130, as detailed below. Although carrier assembly 100 is described hereinbelow as configured for use during the Surface Mount Technology (SMT) phase of PCBA manufacturing, it is contemplated that carrier assembly 100 may additionally or alternatively be utilized during other phases of PCBA manufacturing.

Referring to FIGS. 1A and 2, bottom frame 110 of carrier assembly 100 defines a generally-rectangular configuration and is adjustable in the length and/or width directions thereof to enable adjustment of bottom frame 110 to suitable dimensions for a particular use. More specifically, bottom frame 110 includes a pair of side rails 112, a pair of end rails 114, and four corner brackets 116. Each corner bracket 116 includes a side rail portion 118a and an end rail portion 118b. The side-rail and end-rail portions 118a, 118b of each corner bracket 116 extend in generally perpendicular orientation relative to one another. The side rail portions 118a of corner brackets 116 at one end of bottom frame 110 are fixedly engaged to the side rails 112 in overlapping relation thereof, while the side rail portions 118a of corner brackets 116 at the other end of bottom frame 110 are slidably coupled to the side rails 112 in overlapping relation therewith. Alternatively, the side rail portions 118a of corner brackets 116 at both ends of bottom frame 110 may be slidably coupled to the side rails 112 in overlapping relation thereof, or, in embodiments where length adjustment is not desired, the side rail portions 118a of corner brackets 116 at both ends of bottom frame 110 may be fixed relative to the side rails 112.

In embodiments where the side rail portions 118a of corner brackets 116 are slidably coupled to the side rails 112 at least one end of bottom frame 110, the pairs of corner brackets 116 at opposing ends of bottom frame 110 may be moved towards one another, such that the corner brackets 116 further overlap the side rails 112 slidably coupled thereto to decrease the overall length of bottom frame 110. The pairs of corner brackets 116 at opposing ends of bottom frame 110 may also be moved apart from one another, such that the corner brackets 116 expose more of the side rails 112 slidably coupled thereto to increase the overall length of bottom frame 110.

The end rail portions 118b of corner brackets 116 on one side of bottom frame 110 are fixedly engaged to the end rails 114 in overlapping relation thereof, while the end rail portions 118b of corner brackets 116 on the other side of bottom frame 110 are slidably coupled to the end rails 114 in overlapping relation therewith. Alternatively, the end rail portions 118b of corner brackets 116 on both sides of bottom frame 110 may be slidably coupled to the end rails 114 in overlapping relation thereof, or, in embodiments where width adjustment is not desired, the end rail portions 118b of corner brackets 116 on both sides of bottom frame 110 may be fixed relative to the end rails 114.

In embodiments where the end rail portions 118b of corner brackets 116 are slidably coupled to the end rails 114 on at least one side of bottom frame 110, the pairs of corner brackets 116 at opposing sides of bottom frame 110 may be moved towards one another, such that the corner brackets 116 further overlap the end rails 114 slidably coupled thereto to decrease the overall width of bottom frame 110. The pairs of corner brackets 116 on opposing sides of bottom frame 110 may also be moved apart from one another, such that the corner brackets 116 expose more of the end rails 114 slidably coupled thereto to increase the overall width of bottom frame 110.

The above-detailed length and/or width adjustment of bottom frame 110 may be configured such that bottom frame 110 is continuously movable to any suitable position wherein, for example, friction-fit engagement between the corner brackets 116 and the side or end rails 112, 114, respectively, maintains the desired length or width of bottom frame 110. Alternatively, bottom frame 110 may be incrementally movable to any one of a plurality of discrete positions wherein, for example, complementary engaging features, e.g., protrusions and detents, spring pins and aperture, snap-fit components, etc., on the corner brackets 116 and the side or end rails 112, 114, respectively, maintain the length or width of bottom frame 110 at each of the discrete positions.

Figure 3A:
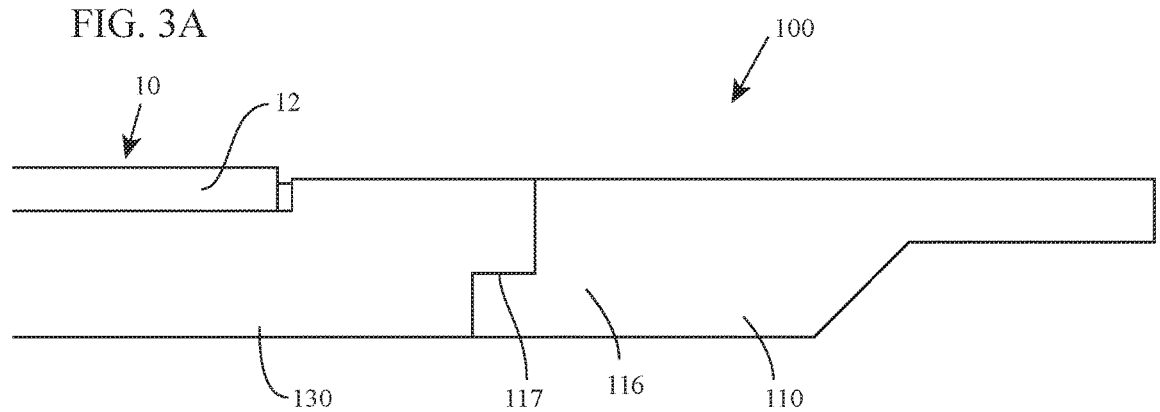
FIG. 3A is a longitudinal, cross-sectional view of one end portion of the carrier assembly of FIG. 1A, including a circuit board supported thereon and the cover removed.
Figure 3B:
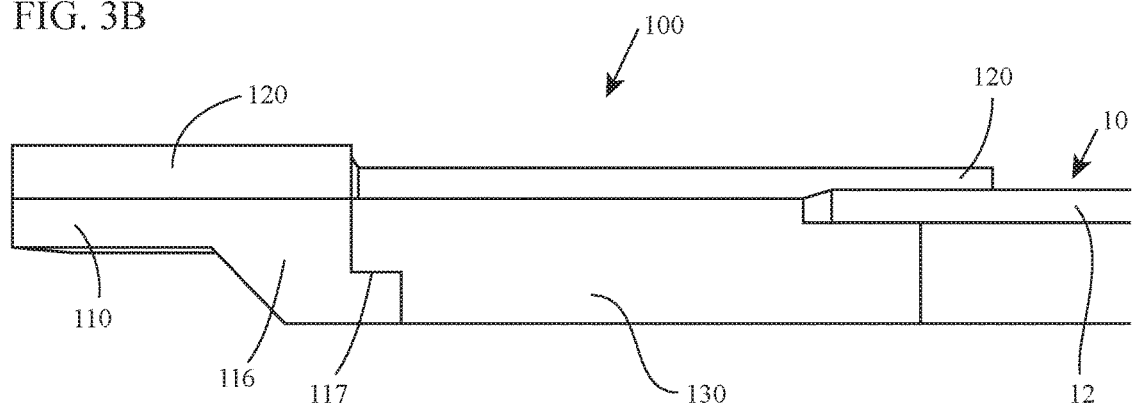
FIG. 3B is a longitudinal, cross-sectional view of the other end portion of the carrier assembly of FIG. 1A, including a circuit board supported thereon and the cover disposed thereon.

With momentary reference to FIGS. 3A and 3B, corner brackets 116 each include shelves 117 extending inwardly into bottom frame 110 from either or both of the side-rail and end-rail portions 118a, 118b, respectively, thereof. Alternatively or additionally, side rails 112 and/or end rails 114 may include shelves 117. Shelves 117, as detailed below, are configured to support core 130 thereon with side rails 112, end rails 114, and corner bracket 116 surrounding core 130. As such, with bottom frame 110 adjusted to the appropriate dimensions based upon the core 130 utilized, and having the core 130 seated therein as noted above, side-to-side or end-to-end motion of core 130 relative to bottom frame 110 is inhibited.

Referring again to FIGS. 1A and 2, bottom frame 110 of carrier assembly 100 is configured as a reusable component and, as can be appreciated, provides versatility for use in various different applications due to the above-described length and/or width adjustability thereof. Bottom frame 110 may be formed from 3D printing or other suitable manufacturing process, e.g., traditional manufacturing process such as molding, stamping, etc. Bottom frame 110 may be formed from any suitable material(s) such as, for example, plastic, metal, etc., and may be formed from a single material or may include different portions formed from different materials and/or via different manufacturing processes.

Top frame 120 of carrier assembly 100 is best illustrated in FIGS. 1B and 2. Top frame 120, in some embodiments, is not provided. In other embodiments, top frame 120 is provided but is utilized for only a portion of the manufacturing phase(s) that carrier assembly 100 is utilized. Thus, in such embodiments, top frame 120 is removed for other portions of the manufacturing phase(s). Top frame 120 is similar to bottom frame 110, defines a generally-rectangular configuration, and is adjustable in the length and/or width directions thereof, similarly as detailed above with respect to bottom frame 110 and, thus, is not described again here. Top frame 120 thus includes a pair of side rails 122, a pair of end rails 124, and four corner brackets 126.

Top frame 120 of carrier assembly 100 is configured as a reusable component and, like bottom frame 110, provides versatility for use in various different applications due to the above-described length and/or width adjustability thereof. Top frame 120 may be formed from 3D printing or other suitable manufacturing process, e.g., traditional manufacturing process such as molding, stamping, etc., may be formed from any suitable material(s) such as, for example, plastic, metal, etc., and may be formed from a single material or may include different portions formed from different materials and/or via different manufacturing processes.

Top frame 120 may additionally include shelves 127, similarly as detailed above with respect to shelves 117 of bottom frame 110. Shelves 127 may be configured to overlap edge portions of core 130 and/or may be configured to overlap edge portions of circuit board 12 of PCBA 10 in order to retain core 130 and/or circuit board 12 in the vertical direction. More specifically, top frame 120 is configured for positioning on bottom frame 110 in alignment therewith with suitable clearance defined between shelves 117 of bottom frame 110 and shelves 127 of top frame for retention of circuit board 12 and core 130 therebetween, thereby inhibiting movement of core 130 and/or circuit board 12 in the vertical direction, e.g., up or down. Together with the side-to-side and end-to-end retention provided by bottom frame 110, bottom and top frames 110, 120, respectively, thus may be utilized to inhibit movement of circuit board 12 and core 130 in all three coordinate axial directions. Of course, where vertical retention is not needed, top frame 120 may be removed and bottom frame 110 may be utilized to provide the above-detailed side-to-side and end-to-end retention.

Referring to FIG. 1B, bottom and top frames 110, 120, respectively, may be releasably engagable with one another in any suitable manner. For example, clamps 140 may be provided to engage bottom and top frames 110, 120, respectively, with one another. Clamps 140 may be engaged with bottom frame 110, top frame 120, may include portions on both bottom and top frames 110, 120, respectively, that are engagement with one another, or may be separate from both bottom and top frames 110, 120, respectively. Other suitable engagement structures other than clamps 140 are also contemplated such as, for example, mechanical interlocks, straps, snap-fit connections, threaded connections, etc.

With reference to FIGS. 1A and 2, core 130, as noted above, is configured to be seated on bottom frame 110 and, more specifically, on shelves 117 of bottom frame 110 with side rails 112, end rails 114, and corner bracket 116 of bottom frame 110 surrounding core 130. Core 130 is configured to support circuit board 12 of PCBA 10 thereon. More specifically, core 130 is a customized component that is specific to a particular configuration of PCBA(s) 10 to be manufactured. That is, while bottom and top frames 110, 120, respectively, are length and/or width adjustable to accommodate different configurations of PCBAs 10, a customized core 130 is utilized for each PCBA configuration or group of PCBA configurations to be manufactured.

Core 130 is manufactured via 3D printing, which enables various different cores 130 to be customized to the particular configuration of PCBA 10 without the need for tooling or other dedicated manufacturing equipment. Each core 130, more specifically, may be 3D printed from a digital model file (e.g., created on a general purpose computer with suitable CAD software) designed based upon the configuration of the PCBA 10 to be manufactured therewith. As can be appreciated, 3D printing enables customization of core 130 to almost any configuration, including complex geometries.

Core 130 may be formed from a high-temperature grade 3D printing material or materials. In other embodiments, various different materials may be utilized for 3D printing core 130 or may otherwise be incorporated into the resultant core 130 protective heat shield to achieve a desired property throughout or on certain portions of core 130. For example, conductive material may be incorporated into core 130 to make core 130 at least partially conductive; reinforcing material may be incorporated into core 130 to make core 130 stronger in certain areas; higher heat-resistant material may be incorporated into core 130 to increase the thermal protection of the core 130 in certain areas; etc.

Referring also to FIGS. 3A and 3B, core 130, as noted above, is configured to be seated on bottom frame 110. Core 130 is removable from bottom frame 110 and may be replaced with another core 130, depending upon the configuration of the PCBA 10 to be manufactured. In this manner, core 130 is interchangeable. As noted above, when seated on bottom frame 110, core 130 is restrained from side-to-side or end-to-end motion relative to bottom frame 110. Core 130, in turn, is configured to support circuit board 12 thereon and restrain side-to-side or end-to-end motion of circuit board 12 relative to core 130 (due to the customization of core 130 for the circuit board 12) and, thus, bottom frame 110. Top frame 120, when engaged with bottom frame 110, is configured to retain core 130 and circuit board from vertical motion relative to bottom and top frames 110, 120, respectively.

Figure 4:
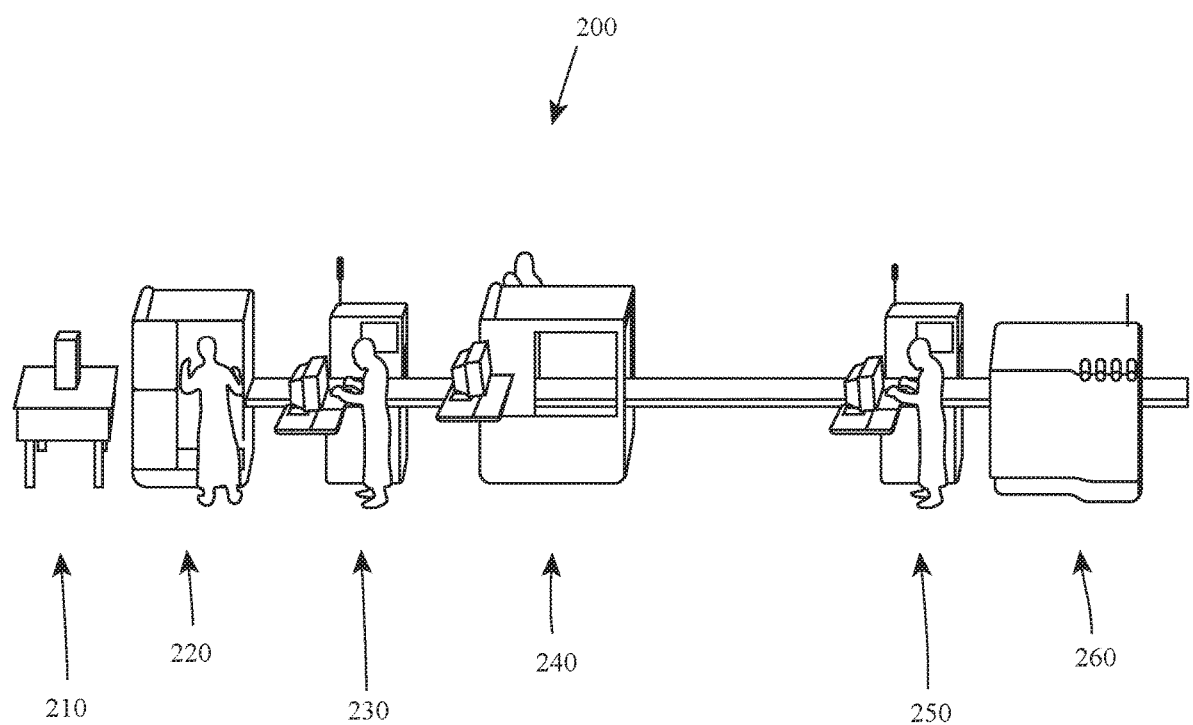
FIG. 4 is a schematic drawing of a portion of an assembly line illustrating a portion of a PCBA manufacturing process flow.

With reference to FIG. 4, in conjunction with FIGS. 1A and 1B, an SMT portion of an assembly line 200 for the manufacture of PCBAs, e.g., PCBA 10, is illustrated. The SMT portion of assembly line 200 includes a board loading station 210, a solder screen printing station 220, a solder paste inspection station 230, a pick and place station 240, an automatic optical inspection station 250, a reflow station 260, and a plurality of additional stations (not shown) disposed before, after, or interdisposed between stations 210-260. Although one particular portion of an assembly line is detailed below, e.g., SMT portion, it is also contemplated that carrier assembly 100 be utilized in different portions of assembly line 200 or for any other suitable manufacturing assembly line or other process, for all or portions thereof.

At the board loading station 210 of assembly line 200, or prior thereto, the circuit board 12 is loaded onto the carrier assembly 100. More specifically, bottom frame 110 is adjusted to the appropriate dimensions, core 130 is seated on bottom frame 110, and circuit board 12 is seated on core 130, as detailed above. Top frame 120 may be disposed on and engaged to bottom frame 110 at this point, or may be omitted at this point.

With the circuit board 12 loaded on the carrier assembly 100, the assembly line 200 proceeds to the solder screen printing station 220, solder paste is applied, and at the solder paste inspection station 230, the solder paste is inspected. At the pick and place station 240, the components that are SMT components are positioned on the circuit board 12 via an SMT machine. At the automatic optical inspection station 250, the PCBA 10 is scanned for failures and defects. At the reflow station 260, the PCBA 10 enters a reflow oven (or other suitable heating device) and is exposed to high temperatures in order to melt the solder paste and permanently connect the components that are SMT components to the circuit board 12.

Core 130, due to its customization for circuit board 12, may be configured to facilitate any or all of the above manufacturing steps, or the manufacturing steps associated with any other portions of assembly line 200. Additionally, top frame 120 may be engaged to bottom frame 110 prior to the reflow station 260, to provide vertical retention of circuit board 12 as it passes through the reflow machine. Carrier assembly 100 may be removed following reflow, may be removed at any point along assembly line 200 thereafter, or may be removed at the completion of manufacturing. Further, core 130 may be replaced with a different core 130 during manufacturing to facilitate completion of various different manufacturing steps and/or bottom frame 110 (and top frame 120, if utilized) may be adjusted in the length and/or width dimensions during manufacturing to facilitate completion of various different manufacturing steps. Alternatively, core 130 and bottom and top frames 110, 120, respectively, may be maintained throughout manufacture of PCBA 10.

Persons skilled in the art will understand that the structures and methods specifically described herein and shown in the accompanying figures are non-limiting exemplary embodiments, and that the description, disclosure, and figures should be construed merely as exemplary of particular embodiments. It is to be understood, therefore, that the present disclosure is not limited to the precise embodiments described, and that various other changes and modifications may be effected by one skilled in the art without departing from the scope or spirit of the disclosure. Additionally, the elements and features shown or described in connection with certain embodiments may be combined with the elements and features of certain other embodiments without departing from the scope of the present disclosure, and that such modifications and variations are also included within the scope of the present disclosure. Accordingly, the subject matter of the present disclosure is not limited by what has been particularly shown and described.

What is claimed is:

1. A carrier assembly configured to facilitate manufacture of a printed circuit board assembly, the carrier assembly comprising:
    a bottom frame defining a generally rectangular configuration and having a length and a width, the bottom frame adjustable to vary at least one of the length or the width thereof;
    a top frame defining a generally rectangular configuration and having a length and a width, the top frame adjustable to vary at least one of the length or the width thereof, the top frame releasably engagable with the bottom frame to retain a core therebetween; and
    the core releasably seated on the bottom frame, the core configured to seat a coplanar circuit board thereon, wherein the core is configured to retain the circuit board in two axial dimensions,
    wherein the carrier assembly includes shelves extending inwardly from the top and bottom frames, the shelves configured to overlap outer edge portions of the core for retention of the core therebetween, thereby inhibiting movement of the core in the vertical direction.

2. The carrier assembly according to claim 1, further comprising at least one clamp configured to releasably engage the top and bottom frames with one another.

3. The carrier assembly according to claim 1, wherein the core is customized to the circuit board configured to be supported thereon.

4. The carrier assembly according to claim 3, wherein the core is formed from a high temperature grade plastic via 3D printing.

5. The carrier assembly according to claim 1, wherein the bottom frame is formed from a metal.

6. The carrier assembly according to claim 1, wherein the bottom frame is reusable and wherein the core is interchangeable.

7. The carrier assembly according to claim 1, wherein the bottom frame is adjustable to vary each of the length and the width thereof.

8. The carrier assembly according to claim 1, wherein the bottom frame is configured to retain the core in two axial directions.

9. The carrier assembly according to claim 1, wherein the bottom frame and the core are coplanar.

10. The carrier assembly according to claim 1, wherein the bottom frame comprises a pair of side rails, a pair of end rails, and four corner brackets, each of the corner brackets include a side rail portion and an end rail portion, in a generally perpendicular orientation.

11. The carrier assembly according to claim 10, wherein at least one of the side rail portions or the end rail portions are slidably coupled to the side rails or end rails, respectively, in overlapping relation.

12. The carrier assembly according to claim 1, wherein the shelves are further configured to overlap outer edge portions of the circuit board for retention of the circuit board therebetween, thereby inhibiting movement of circuit board in the vertical direction.

13. The carrier assembly according to claim 1, wherein two axial dimensions are a length and width respectively, of the carrier assembly.

* * * * *